(12) United States Patent
Hsu et al.

(10) Patent No.: US 8,865,997 B2
(45) Date of Patent: Oct. 21, 2014

(54) THERMOELECTRIC MATERIAL, METHOD FOR FABRICATING THE SAME, AND THERMOELECTRIC MODULE EMPLOYING THE SAME

(75) Inventors: Chia-Chan Hsu, Tainan (TW); Chun-Mu Chen, Hsinchu County (TW); Shan-Haw Chiou, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 188 days.

(21) Appl. No.: 13/463,790

(22) Filed: May 3, 2012

(65) Prior Publication Data
US 2013/0160805 A1     Jun. 27, 2013

(30) Foreign Application Priority Data
Dec. 23, 2011  (TW) .............................. 100148219 A (51) Int. Cl.
*H01L 35/12*     (2006.01)

(52) U.S. Cl.
USPC ...................................................... 136/236.1

(58) Field of Classification Search
None
See application file for complete search history.

(56) References Cited

U.S. PATENT DOCUMENTS

| | | | |
|---|---|---|---|
| 4,589,918 A * | 5/1986 | Nishida et al. ................... 75/244 |
| 6,458,319 B1 * | 10/2002 | Caillat et al. ................... 420/576 |
| 6,613,972 B2 | 9/2003 | Cohen et al. |
| 6,833,083 B2 * | 12/2004 | Imai et al. ................... 252/62.3 T |
| 6,951,456 B2 | 10/2005 | Cohen et al. |
| 7,834,263 B2 | 11/2010 | DeSteese et al. |
| 2001/0029974 A1 | 10/2001 | Cohen et al. |
| 2003/0066476 A1 | 4/2003 | Caillat et al. |
| 2005/0072454 A1 | 4/2005 | Cohen et al. |
| 2005/0115600 A1 | 6/2005 | DeSteese et al. |
| 2007/0125413 A1 | 6/2007 | Olsen et al. |
| 2009/0229647 A1 | 9/2009 | Iersen et al. |
| 2011/0088739 A1 | 4/2011 | Zinn et al. |

FOREIGN PATENT DOCUMENTS

| | | |
|---|---|---|
| CN | 101073831 | 11/2007 |
| CN | 101274368 | 10/2008 |
| CN | 101857928 | 10/2010 |
| EP | 2325344 | 5/2011 |
| JP | 2008016610 | 1/2008 |
| JP | 2008016610 A * | 1/2008 |

OTHER PUBLICATIONS

Taiwan Patent Office, Notice of Allowance, Patent Application Serial No. 100148219, Oct. 21, 2013, Taiwan.

Zhou et al., Preparation and Thermoelectric Properties of beta-$Zn_4Sb_3/Zn_{(1-delta)}Al_{(delta)}O$, Acta Physica Sin., Revised Sep. 2010, Published 2011, pp. 67201-1-67201-6, vol. 60, No. 6, Chinese Physical Society, China.

(Continued)

*Primary Examiner* — Eli Mekhlin (57) ABSTRACT

The invention provides a thermoelectric material, a method for fabricating the same, and a thermoelectric module employing the same. The thermoelectric material is composed of $Zn_4Sb_{(3-x)}Re_x$, wherein $0<x<0.02$. Further, the thermoelectric module includes a first electrode, and a thermoelectric element, wherein the thermoelectric element includes the thermoelectric material composed of $Zn_4Sb_{(3-x)}Re_x$ and contacts to the first electrode; and a second electrode contacting to the thermoelectric element, wherein the first and second electrodes are separated by the thermoelectric element.

7 Claims, 13 Drawing Sheets

(56) References Cited

OTHER PUBLICATIONS

Shanyu Wang et al., "Enhancement of the Thermoelectric Performance of β-$Zn_4Sb_3$ by in Situ Nanostructures and Minute Cd-doping," Acta Materialia, May 2011, pp. 4805-4817, vol. 59, Elsevier, US.

Li-Dong Chen et al., "Recent Progress of Thermoelectric Nanocomposites," Journal of Inorganic Materials, Jun. 2010, pp. 561-568, vol. 25, No. 6, China.

L. Pan et al., "Effects of Ag Doping on Thermoelectric Properties of $Zn_4Sb_3$ at Low Temperatures," Journal of Alloys and Compounds, Sep. 2009, pp. 228-232, vol. 489, Elsevier, US.

Mian Liu et al., "Ag and Cu Doping and Their Effects on the Thermoelectric Properties of β-$Zn_4Sb_3$," Physical Review, Jun. 2010, pp.245215-1-245215-10, vol. B81, The American Physical Society, US.

\* cited by examiner

THERMOELECTRIC MATERIAL, METHOD FOR FABRICATING THE SAME, AND THERMOELECTRIC MODULE EMPLOYING THE SAME

CROSS REFERENCE TO RELATED APPLICATIONS

This application is based upon and claims the benefit of priority from the prior Taiwan Patent Application No. 100148219, filed on Dec. 23, 2011, the entire contents of which are incorporated herein by reference.

BACKGROUND

1. Field

The technical field relates to a thermoelectric material and a method for fabricating the same, and a thermoelectric module employing the same.

2. Description

The power generation principle of a thermoelectric device relies upon the thermoelectric effect (also known as Seebeck effect) of the thermoelectric material formed thereby. According to the thermoelectric effect, a current is generated by a temperature difference between a provided heat source and an ambient temperature. As a solid state material having no moving parts, a thermoelectric device has the advantages of high reliability, long lifespan, and making no noise. Further, when generating power with waste heat, the thermoelectric device may be adapted to reduce the output of environmental thermal pollution.

A thermoelectric device is a combination of multiple groups of N-type and P-type thermoelectric materials. Each group produces current and electrical energy in accordance with temperature differences along the thermoelectric material.

Thermoelectric material is one of the simplest technologies for energy conversion. Through conductive electrons of thermoelectric material, heat energy is transferred to electrical power or move from a cold side to a hot side in a non-mechanical manner. Therefore, thermoelectric material has the potential for applications in cogeneration device, portable electric power and air-conditioning systems.

The energy conversion efficiency of a thermoelectric material is closely related to the dimensionless thermoelectric figure of merit ZT. The thermoelectric figure of merit ZT is given by $ZT=S^2\delta/k$, wherein S is a Seebeck coefficient, $\delta$ is electrical conductivity, and k is thermal conductivity.

A high performance thermoelectric material has a high Seebeck coefficient, high electrical conductivity and low thermal conductivity. In general, an increase in the Seebeck coefficient normally implies a decrease in electrical conductivity. Materials with high electrical conductivity (such as metal) exhibits high thermal conductivity simultaneously, and an insulator has low thermal conductivity. Therefore, the material is intrinsically with limitations of the ZT value.

BRIEF SUMMARY

An exemplary embodiment provides a thermoelectric material having a formula:

$Zn_4Sb_{(3-x)}Re_x$, wherein Zn is zinc, Sb is antimony and Re is rhenium wherein, $0<x<0.02$.

An exemplary embodiment also provides a method for fabricating the aforementioned thermoelectric material. The method includes: mixing a first material and a second material to obtain a mixture, wherein the first material comprises Zn and Sb elements, and the second material comprises Re element, and wherein the ratio of Zn atoms and Sb atoms of the mixture is 4:3, and the ratio of Sb atoms and Re atoms is more than 150 (the ratio of Sb atoms of the first material and Re atoms of the second material is 3:0.01, or 3:0.0001); and subjecting the mixture to a sintering process, obtaining the aforementioned thermoelectric material.

According to embodiments further provide a thermoelectric module including: a first electrode; a thermoelectric element contacting to the first electrode, wherein the thermoelectric element includes the aforementioned thermoelectric material; and a second electrode contacting to the thermoelectric element, wherein the first electrode and the second electrode are separated by the thermoelectric element.

A detailed description is given in the following embodiments with reference to the accompanying drawings.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
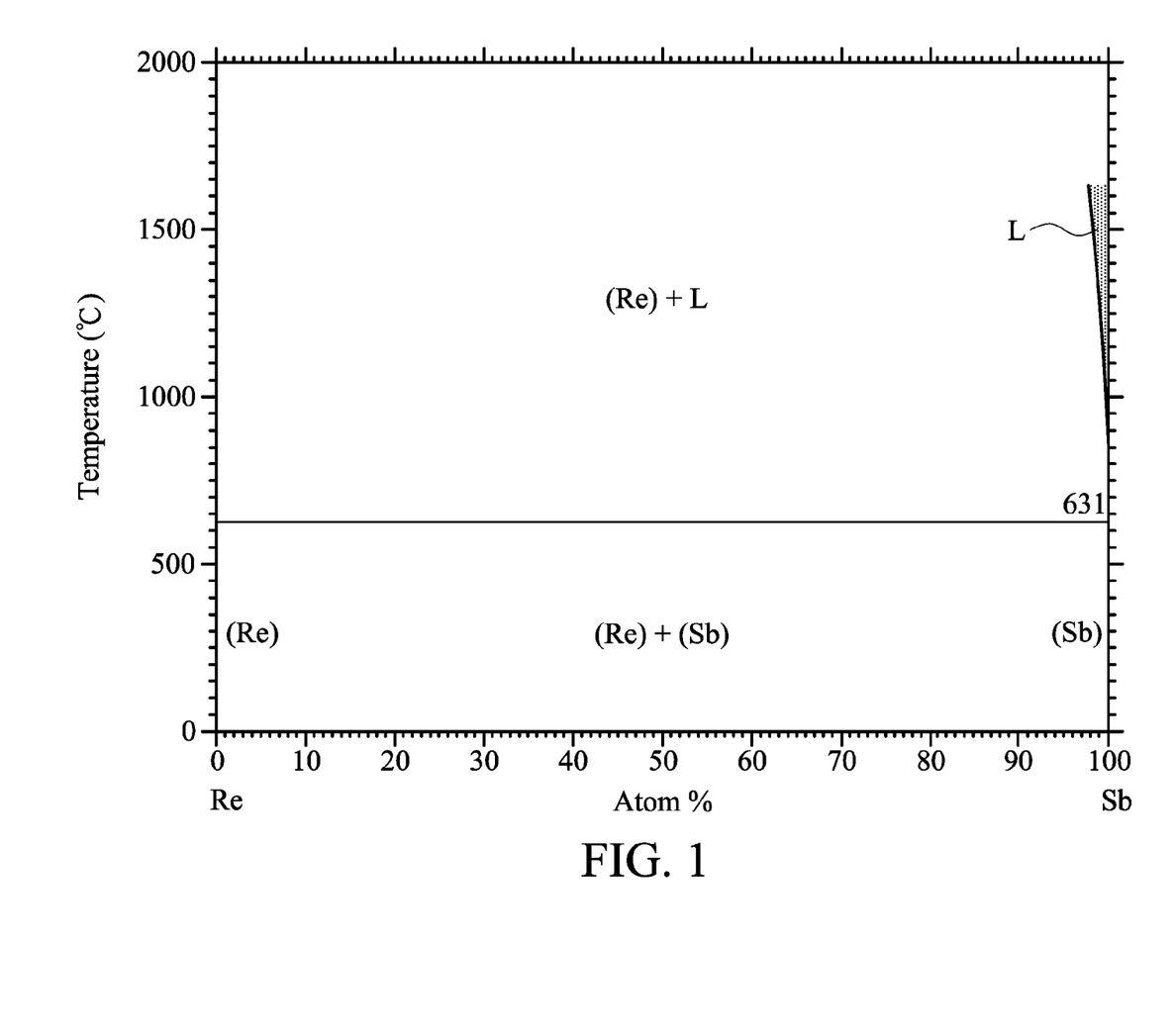
FIG. 1 shows a schematic phase diagram of Re—Sb with various Re/Sb atomic ratios.

The thermoelectric material with high electrical conductivity and Seebeck coefficient of the embodiment has a formula of: $Zn_4Sb_{(3-x)}Re_x$, wherein, x is less than 0.02. For example, x is between 0.0001-0.0199, 0.0001-0.019, 0.0001-0.01, or 0.0005-0.007. It should be noted that, the thermoelectric material having the formula of $Zn_4Sb_{(3-x)}Re_x$ may be prepared with expected success when x is less than 0.02. Please refer to FIG. 1, showing a schematic phase diagram of Re—Sb. As shown in FIG. 1, when x is equal to or more than 0.02, the thermoelectric material has to be sintered at a temperature of more than 1000° C., so that $Zn_4Sb_3$ would be very unstable (undergoing disintegration) and have a inferior merit.

The method for fabricating a thermoelectric material includes mixing a first material and a second material to obtain a mixture, wherein the first material comprises Zn and Sb elements, and the second material comprises Re element, and wherein the ratio of Zn atoms and Sb atoms of the mixture is 4:3, and the ratio of Sb atoms and Re atoms is more than 150 (for example the ratio can be 151-30000, 158-30000, 300-30000, or 428-6000); and subjecting the mixture to a sintering process, obtaining the aforementioned thermoelectric material.

According to an embodiment, the thermoelectric material can be fabricated by a powder metallurgy process, and the method for fabricating the thermoelectric material can include the following steps:

First, a $Zn_4Sb_3$ powder is provided (or an Sb powder and a Zn powder are provided, wherein the ratio of Zn atom and Sb atom is 4:3). In an embodiment, the $Zn_4Sb_3$ powder can have a particular size of less than 50 μm. Next, an Re powder having a purity of more than 99.99% is provided, wherein the Re powder can have a particular size of less than 5 μm. Next, the $Zn_4Sb_3$ powder and the Re powder are mixed, wherein the ratio of Re atoms and $Zn_4Sb_3$ molecules is less than 0.02. Finally, the mixture is subjected to a sintering process at a temperature of 350-450° C. under single continuous pressing, under uniform pressure pressing, or between dual opposed pressing. Particularly, before the sintering process, the mixture can be cool molded, under an air atmosphere or vacuum. Further, the sintering process can be a spark plasma sintering process.

The method for fabricating the $Zn_4Sb_3$ powder can include the following steps. First, a Zn powder having a purity of more than 99.99% and an Sb powder having a purity of more than 99.99% are provided, wherein the ratio of Zn atoms and Sb atoms are 4:3. Next, the Zn powder and the Sb powder are disposed into a reaction container. Next, the reaction container is heated and the Zn powder and the Sb powder are melted to form a liquid. Next, the reaction container is then cooled down by water bath cooling, or oil bath cooling, or the liquid is sprayed onto a rotating copper wheel, causing the liquid to solidify and form a solid. Finally, the solid is pulverized to obtain $Zn_4Sb_3$ powder.

According to other embodiments, the thermoelectric material can be prepared by a metallurgical melting process, including the following steps. First, a Zn powder having a purity of more than 99.99%, an Sb powder having a purity of more than 99.99% and an Re powder having a purity of more than 99.99% are disposed into a reaction container under vacuum or inert gas and mixed together, wherein the ratio of Zn atoms and Sb atoms are 4:3, and the ratio of Zn atoms and Re atoms are less than 0.005. Next, the reaction container is heated over the melting point of $Zn_4Sb_3$ (such as 600-1000° C., or 900-1000° C.), and the mixture are melted to form a liquid. Next, the reaction container is then cooled down by water bath cooling, or oil bath cooling, or the liquid is sprayed onto a rotating copper wheel, causing the liquid to solidify and form a solid. Next, the solid is pulverized to obtain a powder, and the powder is then sieved to regulate the particle size to less than 50 μm. Next, the powder is subjected to a sintering process at a temperature of 350-450° C. under single continuous pressing, under uniform pressure pressing, or between dual opposed pressing. Particularly, before the sintering process, the mixture can be cool molded, under an air atmosphere or vacuum. Further, the sintering process can be a spark plasma sintering process.

Figure 11:
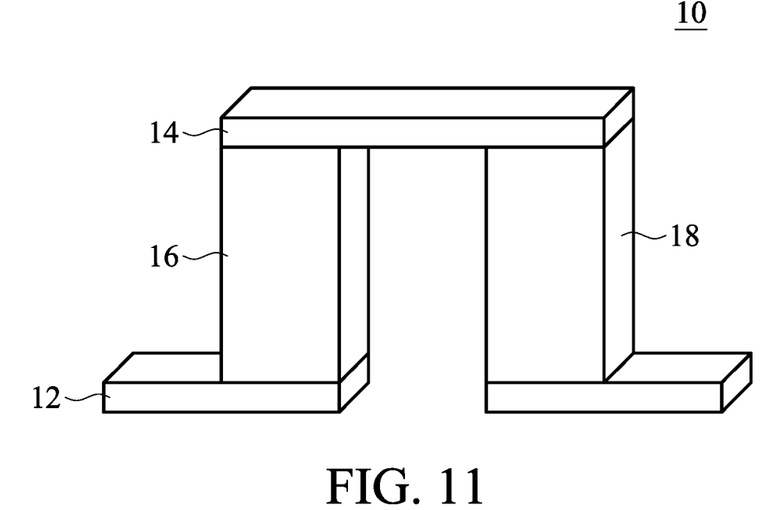
FIG. 11 shows a cross section of a thermoelectric module according to an embodiment.

According to some embodiments, the thermoelectric material can be applied to a thermoelectric module or device for increasing the thermoelectric conversion efficiency. Please refer to FIG. 11, showing a cross section of a thermoelectric module according to an embodiment. The thermoelectric module 10 includes a first electrode 12; a second electrode 14 opposite to the first electrode 12; and a p-type thermoelectric element 16 is disposed between the first electrode 12 and the second electrode 14. The p-type thermoelectric element 16 can include the thermoelectric material of the embodiments and contacts to the first electrode 12 and the second electrode 14 both. The thermoelectric module 10 can further include an n-type thermoelectric element 18 disposed between the first electrode 12 and the second electrode 14, and the n-type thermoelectric element 18 also contacts to the first electrode 12 and the second electrode 14 both.

The following examples are intended to illustrate the disclosure more fully without limiting the scope of the disclosure, since numerous modifications and variations will be apparent to those skilled in this art.

Example 1

First, 41.72 g of Zn powder (purity: 99.99% or more) and 58.28 g of Sb powder (purity: 99.99% or more) were disposed into a reaction container, wherein the atomic ratio of Zn atom and Sb atom was 4:3. Next, the reaction container was vacuumed to $10^{-2}$ torr or less, and then sealed. Next, the reaction container was disposed within a high temperature melting furnace, and then heated with a heating rate of 10° C./min to 800° C. and insulated for 1 hr, causing the Zn and Sb mixture to melt and form a liquid. Next, the reaction container was rapidly cooled in an ice water bath, causing the liquid to solidify and form a $Zn_4Sb_3$ solid block.

Next, the $Zn_4Sb_3$ solid block was milled using a mortar to form a $Zn_4Sb_3$ powder. Next, the $Zn_4Sb_3$ powder was sieved through a 325 mesh to regulate the particle size to less than 50 μm. Next, an Re powder with a particular size of less than 5 μm was mixed with the $Zn_4Sb_3$ powder, wherein the atomic ratio of the Re powder was 0.01 atom % (based on the molecular number of $Zn_4Sb_3$). Next, the mixture and alumina balls were put into a ball mill and subjected to ball milling at 300 rpm for 8 hr.

Next, the results are introduced to a mold (8 mm×15 mm), pressed by a punch in one direction under a pressure 330 MPa, and heated with a heating rate of 10° C./min to 380° C. for 30 min. After cooling, a specimen (8 mm×15 mm×8 mm, 97% occupied) of the thermoelectric material (I) $(Zn_4Sb_{2.9999}Re_{0.0001})$ was obtained.

Figure 2:
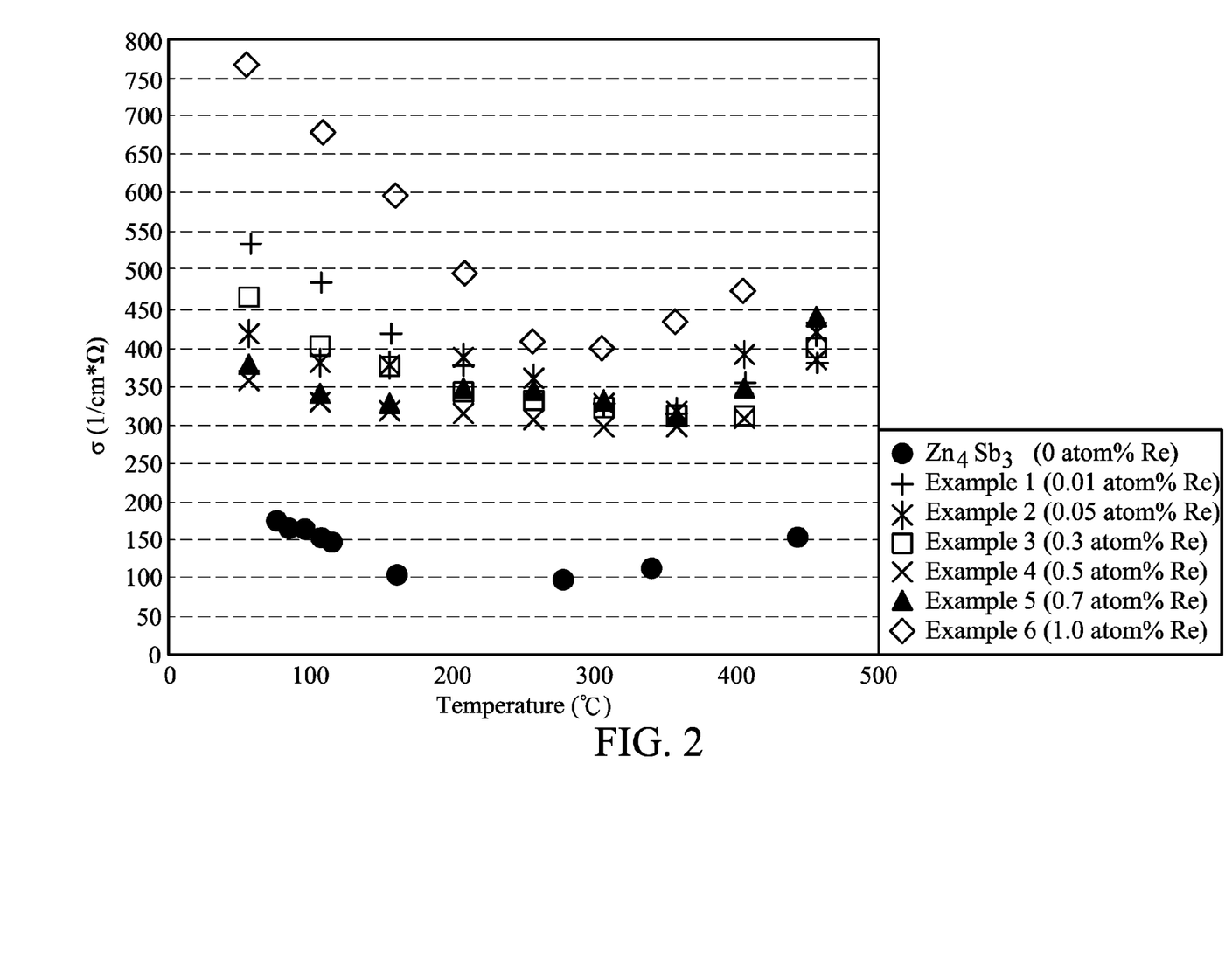
FIG. 2 shows a graph plotting electrical conductivity against temperature for the $Zn_4Sb_3$ thermoelectric material and the thermoelectric material disclosed in Examples 1-6.
Figure 3:
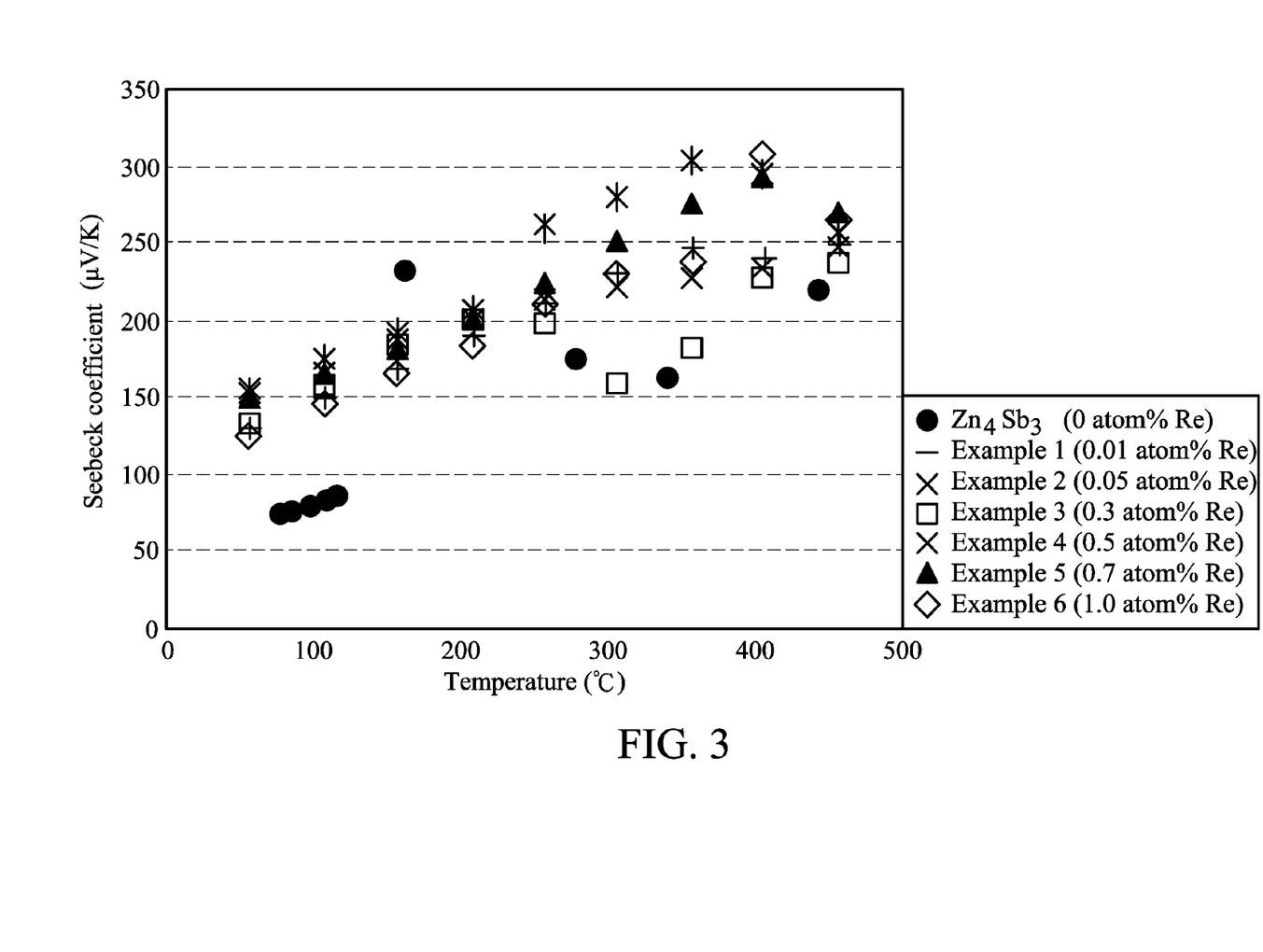
FIG. 3 shows a graph plotting the Seebeck coefficient against temperature for the $Zn_4Sb_3$ thermoelectric material and the thermoelectric material disclosed in Examples 1-6.
Figure 4:
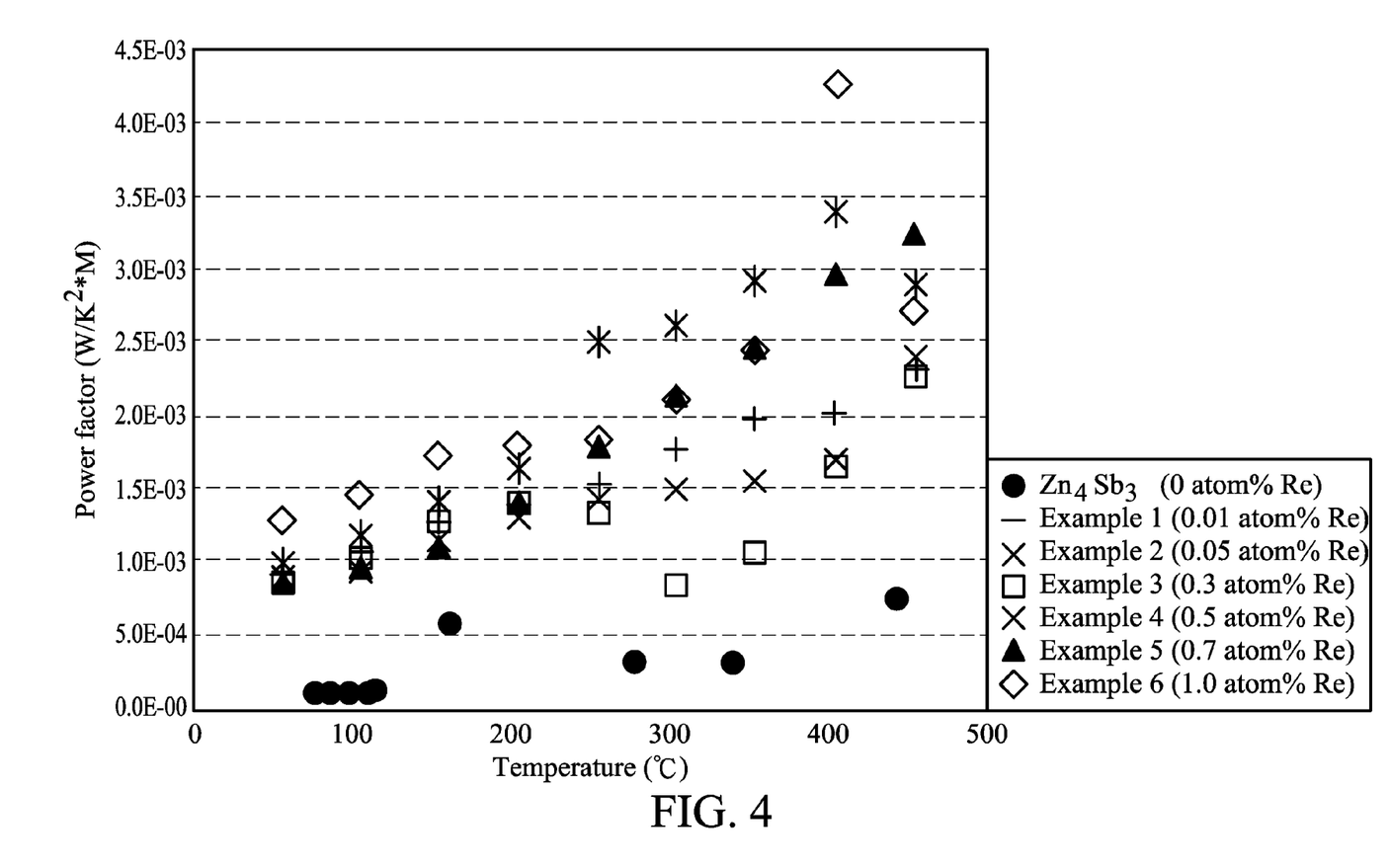
FIG. 4 shows a graph plotting a power factor against temperature for the $Zn_4Sb_3$ thermoelectric material and the thermoelectric material disclosed in Examples 1-6.

The electrical conductivity, Seebeck coefficient, and power factor between 25~450° C. of the thermoelectric material (1) were measured, and the results are shown in FIGS. 2-4. The Seebeck coefficient was measured by placing the sample between a hot end and a cold end, and the temperature difference between the hot end and the cold end was 3-5° C. The electrical conductivity was measured by 4-point dc-measurements. The power factor was calculated from the Seebeck coefficient and electrical conductivity.

Examples 2-6

Example 2 was formed in the same manner as in Example 1 except that the atomic ratio of the Re powder was 0.05 atom %, obtaining the thermoelectric material (II) ($Zn_4Sb_{2.9995}Re_{0.0005}$). Example 3 was formed in the same manner as in Example 1 except that the atomic ratio of the Re powder was 0.3 atom %, obtaining the thermoelectric material (III) ($Zn_4Sb_{2.9995}Re_{0.003}$). Example 4 was formed in the same manner as in Example 1 except that the atomic ratio of the Re powder was 0.5 atom %, obtaining the thermoelectric material (IV) ($Zn_4Sb_{2.9995}Re_{0.005}$). Example 5 was formed in the same manner as in Example 1 except that the atomic ratio of the Re powder was 0.7 atom %, obtaining the thermoelectric material (V) ($Zn_4Sb_{2.993}Re_{0.007}$). Example 6 was formed in the same manner as in Example 1 except that the atomic ratio of the Re powder was 1 atom %, obtaining the thermoelectric material (VI) ($Zn_4Sb_{2.99}Re_{0.01}$). The electrical conductivity, Seebeck coefficient, and power factor between 25~450° C. of the thermoelectric materials (2)-(6) were measured, and the results are shown in FIGS. 2-4.

Example 7

First, 41.72 g of Zn powder (purity: 99.99% or more) and 58.28 g of Sb powder (purity: 99.99% or more) were disposed into a reaction container, wherein the ratio of Zn atom and Sb atom was 4:3. Next, an Re powder was added into the reaction container, wherein the atomic ratio of the Re powder was 0.25 atom % (the molecular number of $Zn_4Sb_3$). The reaction container was vacuumed to $10^{-2}$ torr or less, and then sealed. Next, the reaction container was disposed within a high temperature melting furnace, and then heated with a heating rate of 10° C./min to 1000° C. and insulated for 1 hr, causing the Zn, Sb, and Re mixture to melt and form a liquid. Next, the reaction container was rapidly cooled in an ice water bath, causing the liquid to solidify and form a Zn—Sn—Re containing solid block.

Next, the solid block was milled using a mortar to form a powder. Next, the powder was sieved through a 325 mesh. Next, the powder was introduced to a mold (8 mm×15 mm), pressed by a punch in one direction under a pressure 330 MPa, and heated with a heating rate of 10° C./min to 380° C. for 30 min. After cooling, a specimen (8 mm×15 mm×8 mm, 97% occupied) of the thermoelectric material (VII) (Zn4Sb2.9975Re0.0025) was obtained.

Figure 5:
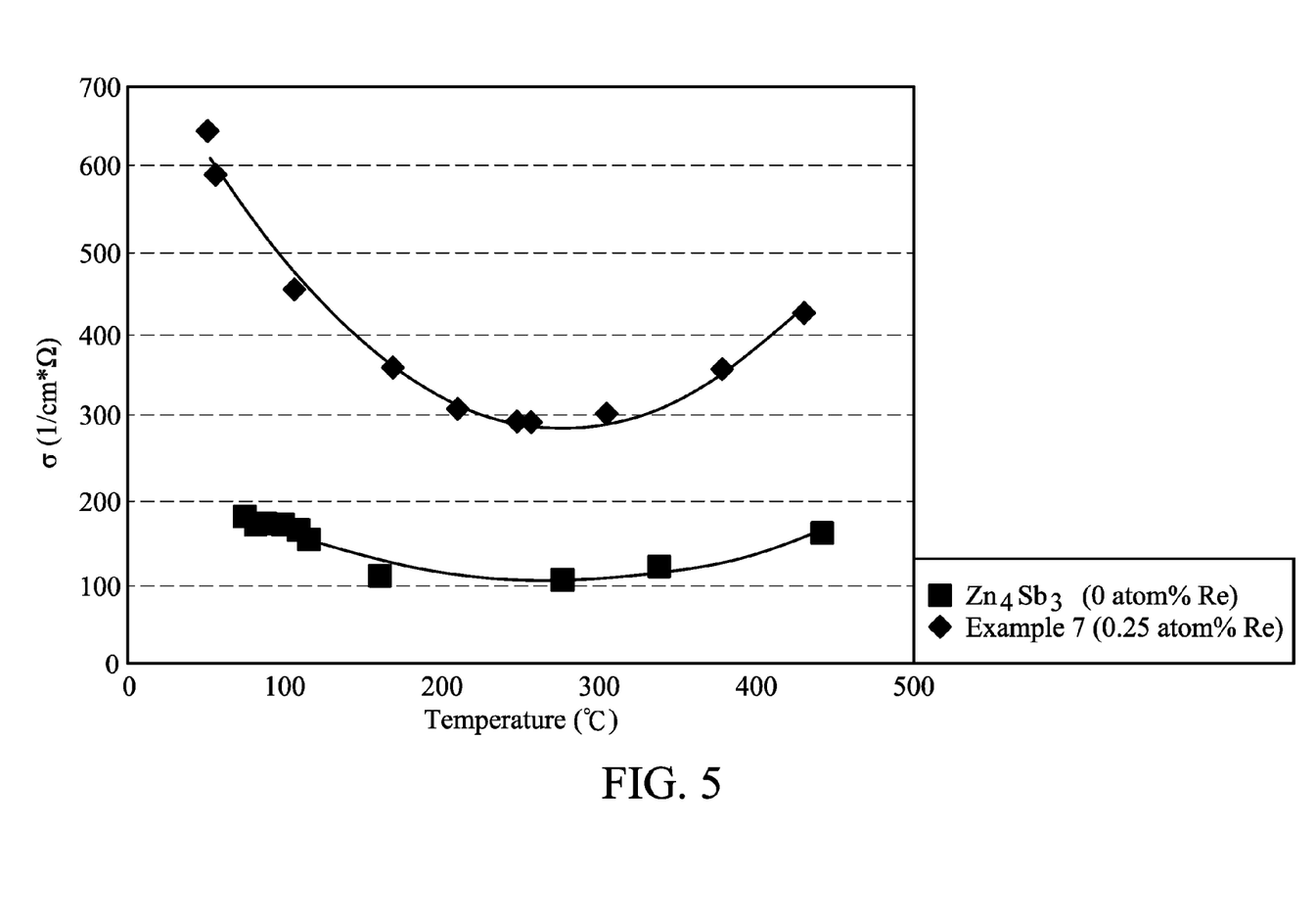
FIG. 5 shows a graph plotting electrical conductivity against temperature for the $Zn_4Sb_3$ thermoelectric material and the thermoelectric material disclosed in Example 7.
Figure 6:
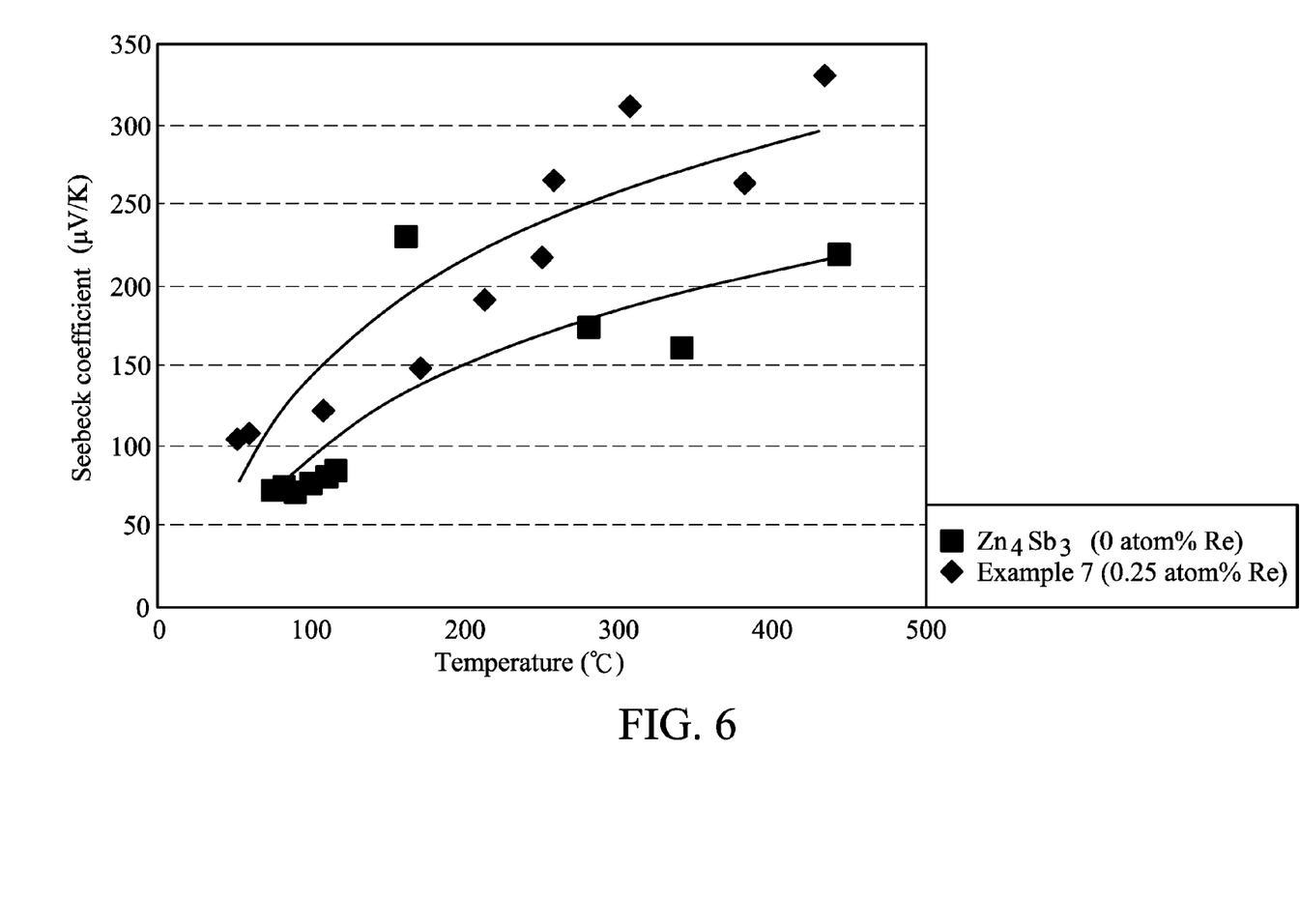
FIG. 6 shows a graph plotting the Seebeck coefficient against temperature for the $Zn_4Sb_3$ thermoelectric material and the thermoelectric material disclosed in Example 7.
Figure 7:
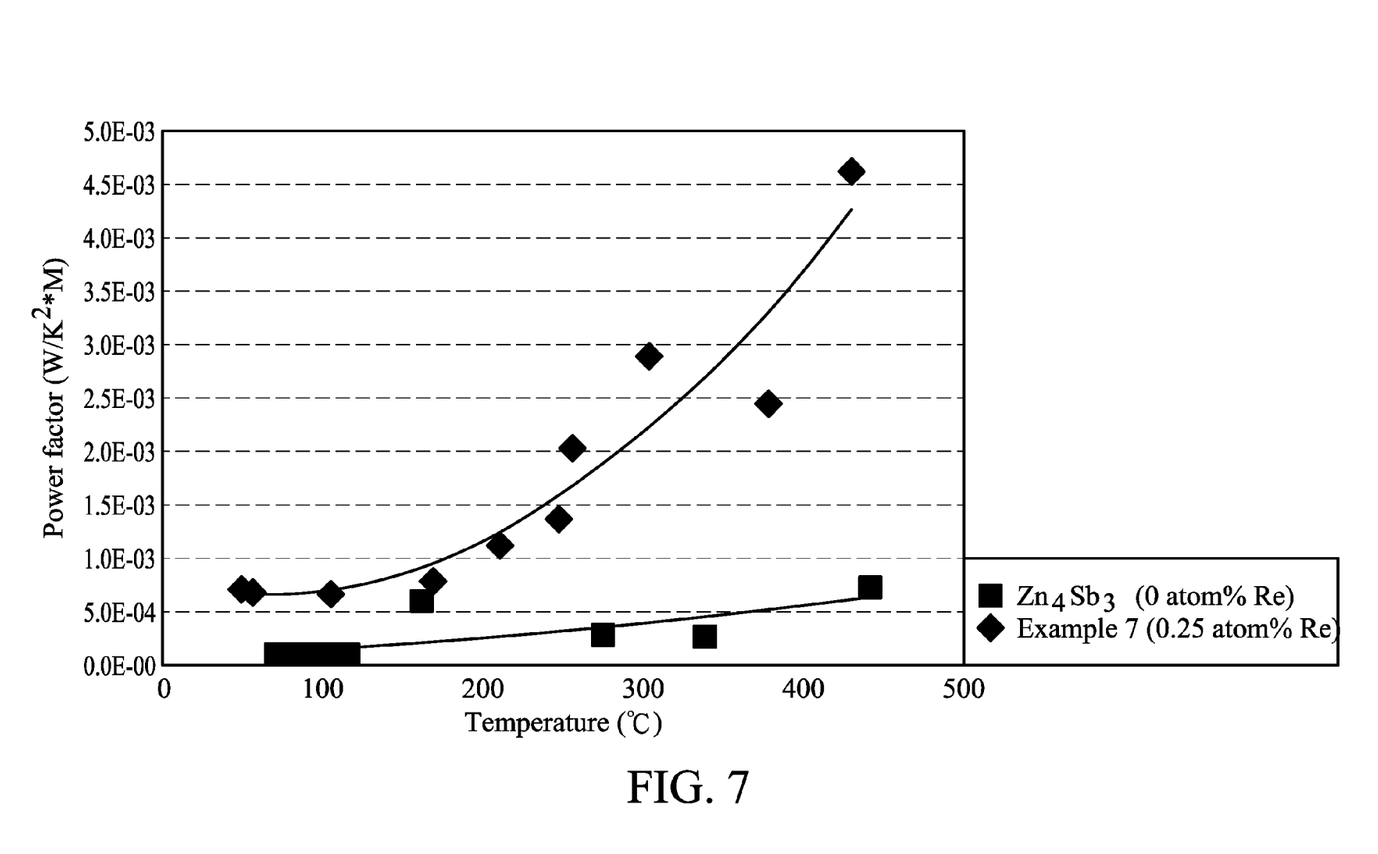
FIG. 7 shows a graph plotting a power factor against temperature for the $Zn_4Sb_3$ thermoelectric material and the thermoelectric material disclosed in Example 7.

The electrical conductivity, Seebeck coefficient, and power factor between 25~450° C. of the thermoelectric material (VII) were measured, and the results are shown in FIGS. 5-7.

Comparative Example 1

Comparative Example 1 was formed in the same manner as in Example 1 except that the atomic ratio of the Re powder was 2 atom %, obtaining the thermoelectric material ($Zn_4Sb_{2.98}Re_{0.02}$). The thermoelectric material was prepared by a sintering process having a process temperature of more than 1000° C. It should be noted, when the atomic ratio of the Re powder was increased to 2 atom %, the thermoelectric material was very difficult to be prepared. Herein, the obtained thermoelectric materials $Zn_4Sb_{2.98}Re_{0.02}$ in the first and second batches underwent a generalized disintegration, and the non-disintegrated thermoelectric material was obtained in the third batch.

Figure 8:
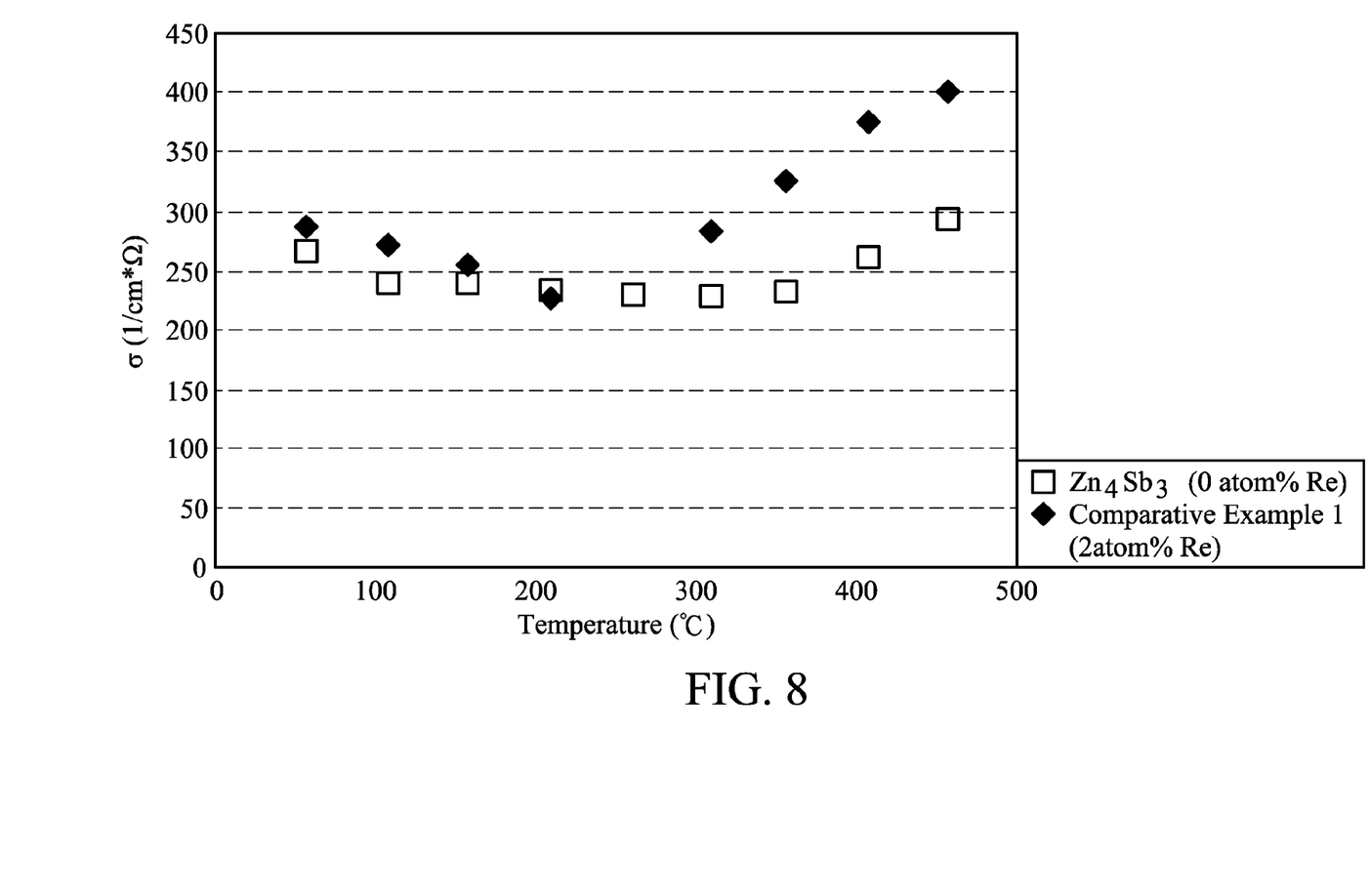
FIG. 8 shows a graph plotting electrical conductivity against temperature for the $Zn_4Sb_3$ thermoelectric material and the thermoelectric material disclosed in Comparative Example 1.
Figure 9:
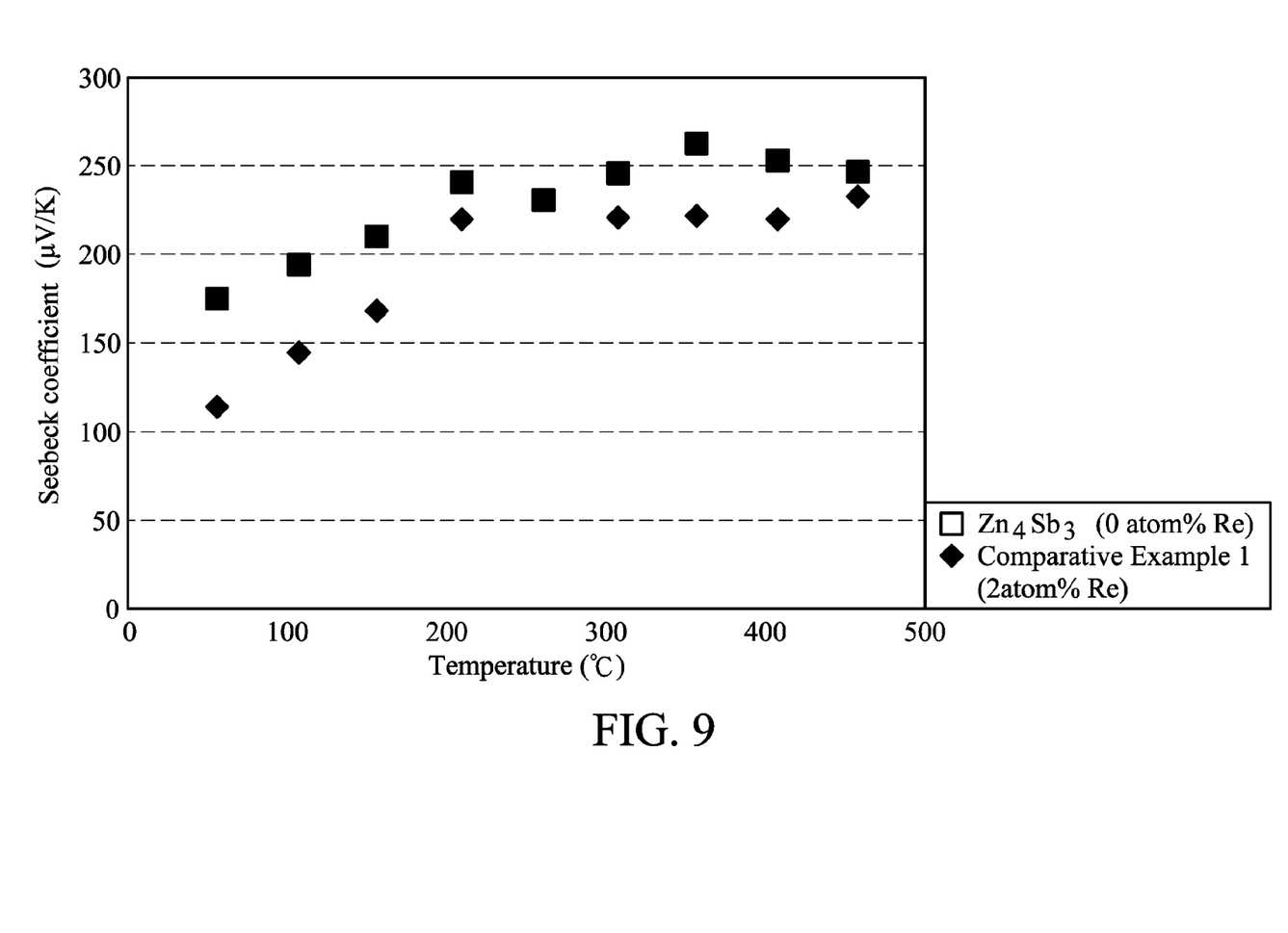
FIG. 9 shows a graph plotting the Seebeck coefficient against temperature for the $Zn_4Sb_3$ thermoelectric material and the thermoelectric material disclosed in Comparative Example 1.
Figure 10:
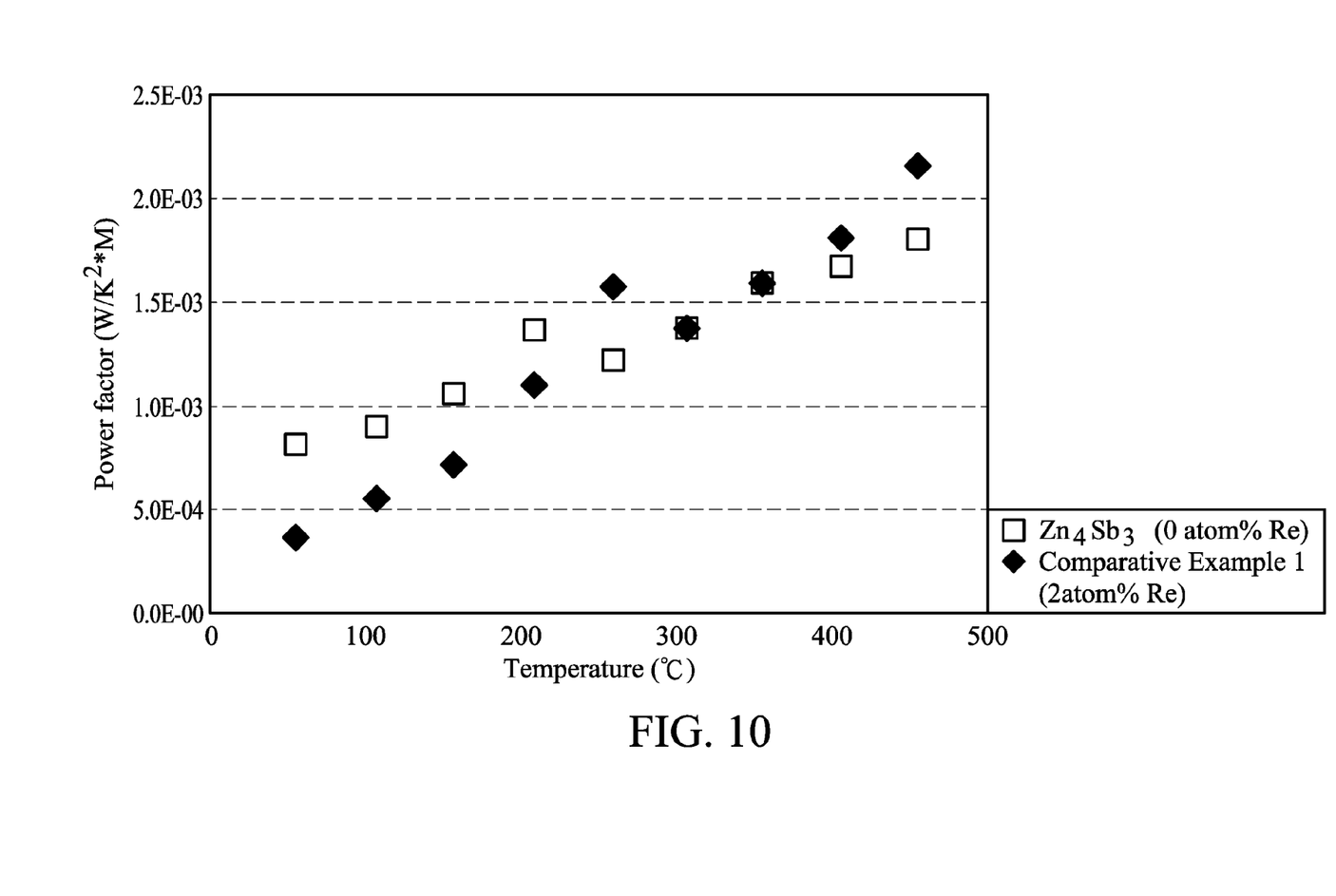
FIG. 10 shows a graph plotting a power factor against temperature for the $Zn_4Sb_3$ thermoelectric material and the thermoelectric material disclosed in Comparative Example 1.

The electrical conductivity, Seebeck coefficient, and power factor between 25~450° C. of the thermoelectric material disclosed in Comparative Example 1 were measured, and the results are shown in FIGS. 8-10.

In comparison with pure $Zn_4Sb_3$, the thermoelectric material $Zn_4Sb_{2.98}Re_{0.02}$ had lower Seebeck coefficient at some specific temperatures. The reasonable assumption is that the Re atom was not be distributed uniformly among the thermoelectric material under the condition that the atomic ratio of the Re powder was increased to 2 atom %.

The thermoelectric materials of the aforementioned Examples can be subjected to ICP-MS (inductively coupled plasma-mass spectrometry) analysis or XPS (x-ray photoelectron spectroscopy) analysis for determining the relative proportion of elements (such as Re and Sb) of different masses.

In comparison with conventional thermoelectric materials, the thermoelectric materials of the embodiment have the following advantages. First, the thermoelectric material of the embodiment is an environmentally friendly p-type thermoelectric material. PbTe is currently the p-type thermoelectric material. However, Pb is a toxic element capable of adversely affecting the human body (even as low as 0.001 microgram). Therefore, the thermoelectric material of the embodiment can be substituted for PbTe, thereby avoiding the use of Pb.

Second, the thermoelectric material of the embodiment exhibit both increased Seebeck coefficient and electrical conductivity in comparison with pure $Zn_4Sb_3$. Due to the high electrical conductivity of the Re atom, the thermoelectric material of the invention has increased electrical conductivity. Further, due to the high elasticity modulus (370 GPa) of Re, the thermoelectric material has increased Seebeck coefficient, since Re can form a potential barrier in the interface, exclude electrons with low energy, and enhance the density of the state near the Fermi level. On the other hand, since Sb is replaced with Re in the thermoelectric material, the lattice structure of $Zn_4Sb_3$ is maintained, and additional four holes of the lattice structure is generated for enhancing the electrical conductivity.

Figure 12:
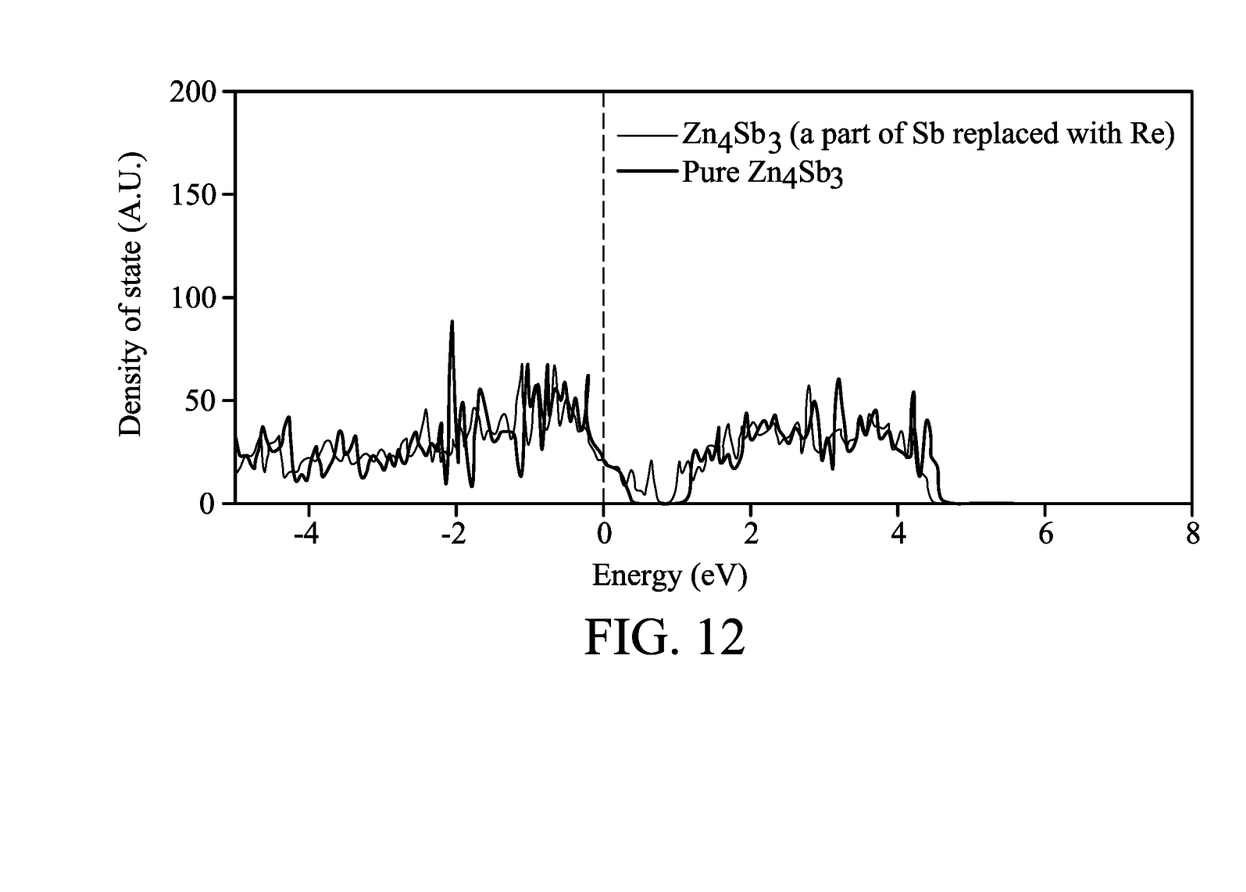
FIG. 12 shows a graph plotting density of state against energy for the $Zn_4Sb_3$ thermoelectric material and the $Zn_4Sb_3$ thermoelectric material with a part of Sb replaced with Re.
Figure 13:
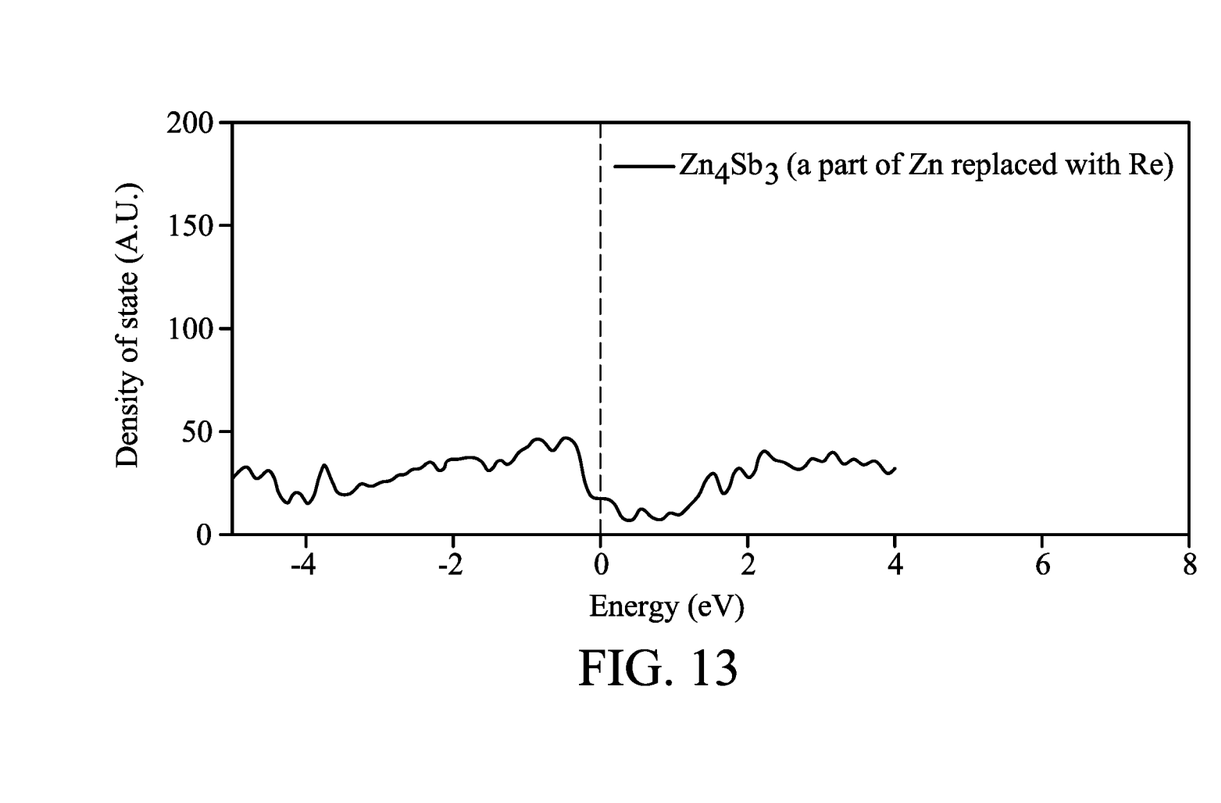
FIG. 13 shows a graph plotting density of state against energy for the $Zn_4Sb_3$ thermoelectric material and the $Zn_4Sb_3$ thermoelectric material with a part of Zn replaced with Re.

The density of the state against the energy for the thermoelectric material of the invention (i.e. $Zn_4Sb_3$ with a part of Sb replaced with Re) was simulated by VASP (Vienna ab-initio Simulation Package), and the results are shown in FIG. 12. On the other hand, the density of the state against the energy for the thermoelectric material $Zn_4Sb_3$ with a part of Zn replaced with Re was also simulated by VASP (Vienna ab-initio Simulation Package), and the results are shown in FIG. 13. As shown in FIG. 12, band gaps of pure $Zn_4Sb_3$ and $Zn_4Sb_3$ with a part of Sb replaced with Re were observed, making sure that pure $Zn_4Sb_3$ and $Zn_4Sb_3$ with a part of Sb replaced with Re were semiconductor material. Further, since the $Zn_4Sb_3$ with a part of Sb replaced with Re has a smaller band gap than that of pure Zn4Sb3, the $Zn_4Sb_3$ with a part of Sb replaced with Re has a higher electrical conductivity in comparison with pure $Zn_4Sb_3$, corresponding with the results shown in FIG. 1-7

Further, since there is no band gap observed in FIG. 13 (the curve shown in FIG. 13 does not intersect to the x-axis), it means that the $Zn_4Sb_3$ with a part of Zn replaced with Re is a metallic conductor. However, according to the results shown in FIGS. 1-7, the thermoelectric materials disclosed in Examples 1-7 are semiconductor materials. Accordingly, the thermoelectric materials prepared from the method for fabricating thermoelectric material of the invention are $Zn_4Sb_3$-based materials with a part of Sb replaced with Re in the lattice structure. The aforementioned facts can be also proved by measuring the band gap of the thermoelectric materials via an XPS (x-ray photoelectron spectroscopy).

The embodiments provide thermoelectric materials and methods for fabricating the same. Particularly, since the amount of Sb atoms of $Zn_4Sb_3$ has been replaced with Re atoms in the thermoelectric material for increasing the electrical conductivity and Seebeck coefficient simultaneously, the merit ZT of the thermoelectric material is improved. Therefore, the thermoelectric material is suitable to be applied to a thermoelectric module.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A thermoelectric material, having a formula:

$$Zn_4Sb_{(3-x)}Re_x,$$

wherein, $0 \leq x \leq 0.02$.

2. A thermoelectric module, comprising:
a first electrode;
a thermoelectric element contacting to the first electrode, wherein the thermoelectric element comprises the thermoelectric material as claimed in claim 1; and
a second electrode contacting to the thermoelectric element, wherein the first electrode and the second electrode are separated by the thermoelectric element.

3. A method for fabricating the thermoelectric material as set forth in claim 1, comprising:
mixing a first material and a second material to obtain a mixture, wherein the first material comprises Zn and Sb elements, and the second material comprises Re element, and wherein the atomic ratio of Zn atoms and Sb atoms of the mixture is 4:3, and the atomic ratio of Sb atoms and Re atoms is more than 150:1; and
subjecting the mixture to a sintering process, obtaining the thermoelectric material as claimed in claim 1.

4. The method as claimed in claim 3, wherein the first material comprises a $Zn_4Sb_3$ powder, and the second material comprises an Re powder.

5. The method as claimed in claim 3, wherein the first material comprises a Zn powder and an Sb powder, and the second material comprises an Re powder.

6. The method as claimed in claim 5, before subjecting the mixture to the sintering process, further comprising:
subjecting the mixture to a pre-melting process; and
subjecting the mixture to a milling process after the pre-melting process.

7. The method as claimed in claim 6, wherein the pre-melting process has a process temperature higher than a melting point of $Zn_4Sb_3$.

* * * * *